(12) United States Patent
Tateno et al.

(10) Patent No.: US 12,334,401 B2
(45) Date of Patent: Jun. 17, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Hideto Tateno, Toyama (JP); Satoshi Takano, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 675 days.

(21) Appl. No.: 17/478,321

(22) Filed: Sep. 17, 2021

(65) Prior Publication Data

US 2022/0005738 A1 Jan. 6, 2022

Related U.S. Application Data

(63) Continuation of application No. PCT/JP2019/012282, filed on Mar. 22, 2019.

(51) Int. Cl.
*H01L 21/66* (2006.01)
*C23C 16/34* (2006.01)
(Continued)

(52) U.S. Cl.
CPC ............ *H01L 22/12* (2013.01); *C23C 16/34* (2013.01); *C23C 16/455* (2013.01); *C23C 16/52* (2013.01);
(Continued)

(58) Field of Classification Search
None
See application file for complete search history.

(56) References Cited

U.S. PATENT DOCUMENTS

2002/0055080 A1* 5/2002 Tanaka .................... C23C 16/46
432/128
2005/0059203 A1* 3/2005 Yamamoto ........ H01L 21/67253
438/222
(Continued)

FOREIGN PATENT DOCUMENTS

JP 04-065855 A 3/1992
JP H06252238 A 9/1994
(Continued)

OTHER PUBLICATIONS

JP-4493192-B2 English translation (Year: 2010).*
IPOS Office Action in Singapore Application No. 11202110372Q, dated Nov. 8, 2022, 9 pages.

*Primary Examiner* — Michael G Hoang
*Assistant Examiner* — Kurt J Wolford
(74) *Attorney, Agent, or Firm* — Edell, Shapiro & Finnan, LLC

(57) ABSTRACT

According to one aspect of the present disclosure, there is provided a technique that includes: a substrate retainer; a reaction tube; a heater configured to heat an inside of the reaction tube; a gas supplier configured to supply a process gas to substrates accommodated in the reaction tube; an exhauster configured to exhaust the process gas from the inside of the reaction tube; a temperature detector configured to measure an inner temperature of the reaction tube; a reflectance detector configured to measure a reflectance of a film formed by supplying the process gas through the gas supplier; and a controller configured to be capable of performing a feedback control of film-forming conditions on the substrates accommodated in the reaction tube by using temperature information measured by the temperature detector and reflectance information measured by the reflectance detector.

15 Claims, 9 Drawing Sheets

(51) Int. Cl.
*C23C 16/455* (2006.01)
*C23C 16/46* (2006.01)
*C23C 16/52* (2006.01)
*H01L 21/02* (2006.01)
*H01L 21/285* (2006.01)
*H01L 21/67* (2006.01)
*H01L 21/677* (2006.01)

(52) U.S. Cl.
CPC ...... *H01L 21/02186* (2013.01); *H01L 21/285* (2013.01); *H01L 21/67248* (2013.01); *H01L 21/67757* (2013.01); *C23C 16/46* (2013.01)

(56) References Cited

U.S. PATENT DOCUMENTS

| | | |
|---|---|---|
| 2006/0270246 A1 | 11/2006 | Nagano |
| 2008/0213716 A1 | 9/2008 | Koyama et al. |
| 2010/0003831 A1 | 1/2010 | Yasuda et al. |
| 2010/0124726 A1 | 5/2010 | Sugishita et al. |
| 2011/0033610 A1 | 2/2011 | Bertram, Jr. |
| 2015/0261212 A1 | 9/2015 | Takenaga et al. |
| 2018/0315626 A1* | 11/2018 | Franklin ............... F16J 15/062 |

FOREIGN PATENT DOCUMENTS

| | | |
|---|---|---|
| JP | H1036971 A | 2/1998 |
| JP | 2002-175123 A | 6/2002 |
| JP | 2003-109906 A | 4/2003 |
| JP | 2006-339242 A | 12/2006 |
| JP | 2008-004603 A | 1/2008 |
| JP | 2008-218558 A | 9/2008 |
| JP | 2010-016106 A | 1/2010 |
| JP | 2010-118605 A | 5/2010 |
| JP | 4493192 B2 * | 6/2010 ............. C23C 16/46 |
| JP | 2011-524648 A | 9/2011 |

\* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2019/012282, filed on Mar. 22, 2019, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

In a heat treatment process of a substrate (also referred to as a "wafer") in manufacturing processes of a semiconductor device, for example, a substrate processing apparatus such as a vertical type substrate processing apparatus may be used. In the vertical type substrate processing apparatus, a plurality of substrates are charged into a substrate retainer of the vertical type substrate processing apparatus and supported in a vertical direction by the substrate retainer, and the substrate retainer is loaded into a process chamber of the vertical type substrate processing apparatus. Thereafter, a process gas is introduced into the process chamber while the process chamber is heated to perform a substrate processing such as a film-forming process on the plurality of substrates. In the vertical type substrate processing apparatus described above, a technique of controlling a heater based on a relationship between an accumulative thickness of a film in a reaction furnace (which is a process furnace) and an inner temperature of the reaction furnace may be used.

SUMMARY

Some embodiments of the present disclosure provide a technique capable of forming a film on a substrate while controlling a thickness of the film more accurately by controlling a film-forming process using measurement data during the film-forming process with respect to the substrate.

According to one or more embodiments of the present disclosure, there is provided a technique that includes: a substrate retainer in which a plurality of substrates are supported; a reaction tube in which the plurality of substrates supported by the substrate retainer are accommodated; a heater configured to heat an inside of the reaction tube; a gas supplier configured to supply a process gas to the plurality of substrates accommodated in the reaction tube; an exhauster configured to exhaust the process gas from the inside of the reaction tube; a temperature detector configured to measure an inner temperature of the reaction tube; a reflectance detector configured to measure a reflectance of a film formed by supplying the process gas through the gas supplier; and a controller configured to be capable of performing a feedback control of film-forming conditions on the plurality of substrates accommodated in the reaction tube by using temperature information measured by the temperature detector and reflectance information measured by the reflectance detector.

DETAILED DESCRIPTION

Figure 1:
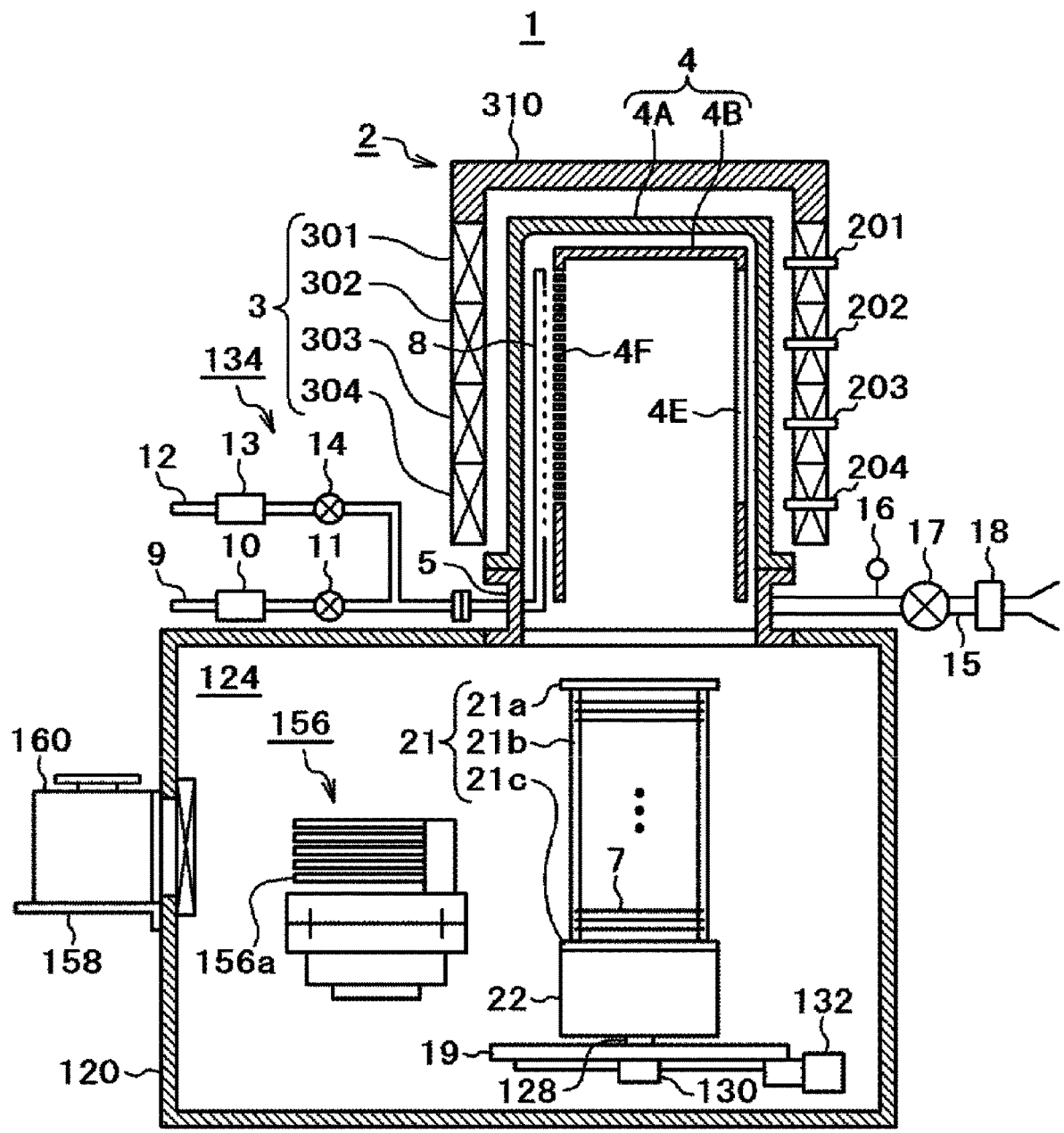
FIG. 1 is a diagram schematically illustrating a configuration of a vertical type substrate processing apparatus according to a first embodiment described herein.

Hereinafter, embodiments according to the technique of the present disclosure will be described with reference to the drawings.

First Embodiment

A configuration of a semiconductor manufacturing apparatus according to a first embodiment will be described with reference to FIGS. 1 through 3.

(1) Overall Configuration of Semiconductor Manufacturing Apparatus

A vertical type substrate processing apparatus (hereinafter, simply referred to as a "processing apparatus") 1 according to the present embodiment is configured as a semiconductor manufacturing apparatus capable of performing a substrate processing such as a heat treatment process. The substrate processing is performed as a part of manufacturing processes in a method of manufacturing a semiconductor device. As shown in FIG. 1, the processing apparatus 1 includes a transfer chamber 124 and a process furnace (which is a reaction furnace) 2 provided above the transfer chamber 124. FIG. 1 schematically illustrates a state in which a boat 21 supporting a plurality of substrates including a substrate 7 is lowered to be located in the transfer chamber 124, and FIG. 2 schematically illustrates a state in which the boat 21 is elevated to be located in the process furnace 2. Hereinafter, the plurality of substrates including the substrate 7 may also be simply referred to as substrates 7.

The process furnace 2 includes a reaction tube 4 of a cylindrical shape extending in a vertical direction and a heater 3 serving as a first heating structure (heating body) attached to a furnace body 310 installed on an outer periphery of the reaction tube 4. For example, the reaction tube 4 is made of a heat resistant material such as quartz (SiO) and silicon carbide (SiC).

A manifold 5 of a cylindrical shape is connected to a lower end opening of the reaction tube 4 via a seal (not shown) such as an O-ring. The manifold 5 is configured to support a lower end of the reaction tube 4. For example, the manifold 5 is made of a metal such as stainless steel. A central opening of the manifold 5 is opened or closed by a lid 19 of a disk shape. For example, the lid 19 is made of a metal. As shown in FIG. 2, a seal 19A such as an O-ring is provided on an upper surface of the lid 19 so that an inner atmosphere of the reaction tube 4 is hermetically (airtightly) sealed from an outside atmosphere.

A heat insulator 22 is placed on the lid 19. For example, the heat insulator 22 is made of quartz. The boat 21 serving as a substrate retainer (substrate holder) is installed above the heat insulator 22. The boat 21 is constituted by a top plate 21a, a bottom plate 21c and a plurality of support columns 21b installed between the top plate 21a and the bottom plate 21c. For example, by placing the substrates 7 in a plurality of grooves provided at the plurality of support columns 21b, the boat 21 is configured to align the substrates 7 (for example, from 25 to 150 substrates) in the vertical direction so as to support the substrates 7 in a multistage manner while the substrates 7 are horizontally oriented with their centers aligned with each other. That is, the boat 21 supports the substrates 7 with predetermined intervals therebetween. For example, the boat 21 is made of a heat resistant material such as quartz and SiC. A substrate retaining structure is constituted by the heat insulator 22 and the boat 21. When the substrate processing is performed, the boat 21 is accommodated in an inner tube 4B.

The heat insulator 22 is connected to a rotating shaft 128 passing through the lid 19. The rotating shaft 128 is connected to a rotator 130 installed below the lid 19. By rotating the rotating shaft 128 by the rotator 130, it is possible to rotate the heat insulator 22 and the boat 21.

A substrate transfer device 156 such as a substrate transfer robot, the boat 21 and a boat elevator 132 serving as an elevating structure are arranged in the transfer chamber 124. The substrate transfer device 156 includes an arm (tweezers) 156a capable of taking out, for example, five substrates including the substrate 7. The substrate transfer device 156 is configured to be capable of transferring the substrate 7 between a pod 160 placed at a position of a pod opener 158 and the boat 21 by rotating the arm 156a up and down by a driving structure (not shown). The boat elevator 132 is configured to transfer the boat 21 into or out of the reaction tube 4 by elevating or lowering the lid 19. A configuration of the transfer chamber 124 will be described later in detail.

The processing apparatus 1 includes a gas supply structure 134 through which gases used in the substrate processing is supplied into the reaction tube 4. The gases supplied through the gas supply structure 134 may be appropriately changed in accordance with a type of a film formed by the substrate processing. The gas supply structure 134 may include a source gas supply structure (which is a source gas supply system), a reactive gas supply structure (which is a reactive gas supply system) and an inert gas supply structure (which is an inert gas supply system).

The source gas supply structure includes a gas supply pipe 9. A mass flow controller (MFC) 10 serving as a flow rate controller (flow rate controlling structure) and a valve 11 serving as an opening/closing valve are sequentially provided at the gas supply pipe 9 in this order from an upstream side to a downstream side of the gas supply pipe 9. The gas supply pipe 9 is connected to a nozzle 8 which passes through a sidewall of the manifold 5. The nozzle 8 extends in the reaction tube 4 along the vertical direction, and the nozzle 8 is provided with a plurality of supply holes open toward the substrates 7 accommodated in the boat 21. A source gas is supplied to the substrates 7 through the plurality of supply holes of the nozzle 8.

A reactive gas is supplied to the substrates 7 through the reactive gas supply structure whose configuration is similar to that of the source gas supply structure via the gas supply pipe 9, the MFC 10, the valve 11 and the nozzle 8. An inert gas is supplied to the substrates 7 through the inert gas supply structure whose configuration is similar to that of the source gas supply structure via a gas supply pipe 12, an MFC 13, a valve 14 and the nozzle 8.

An exhaust pipe 15 is provided at the manifold 5. A vacuum pump 18 serving as a vacuum exhaust apparatus is connected to the exhaust pipe 15 through a pressure sensor 16 serving as a pressure detector (which is a pressure detecting structure) to detect an inner pressure of the reaction tube 4 and an APC (Automatic Pressure Controller) valve 17 serving as a pressure regulator (which is a pressure regulating structure). With such a configuration, it is possible to set the inner pressure of the reaction tube 4 to a process pressure according to the substrate processing.

Figure 2:
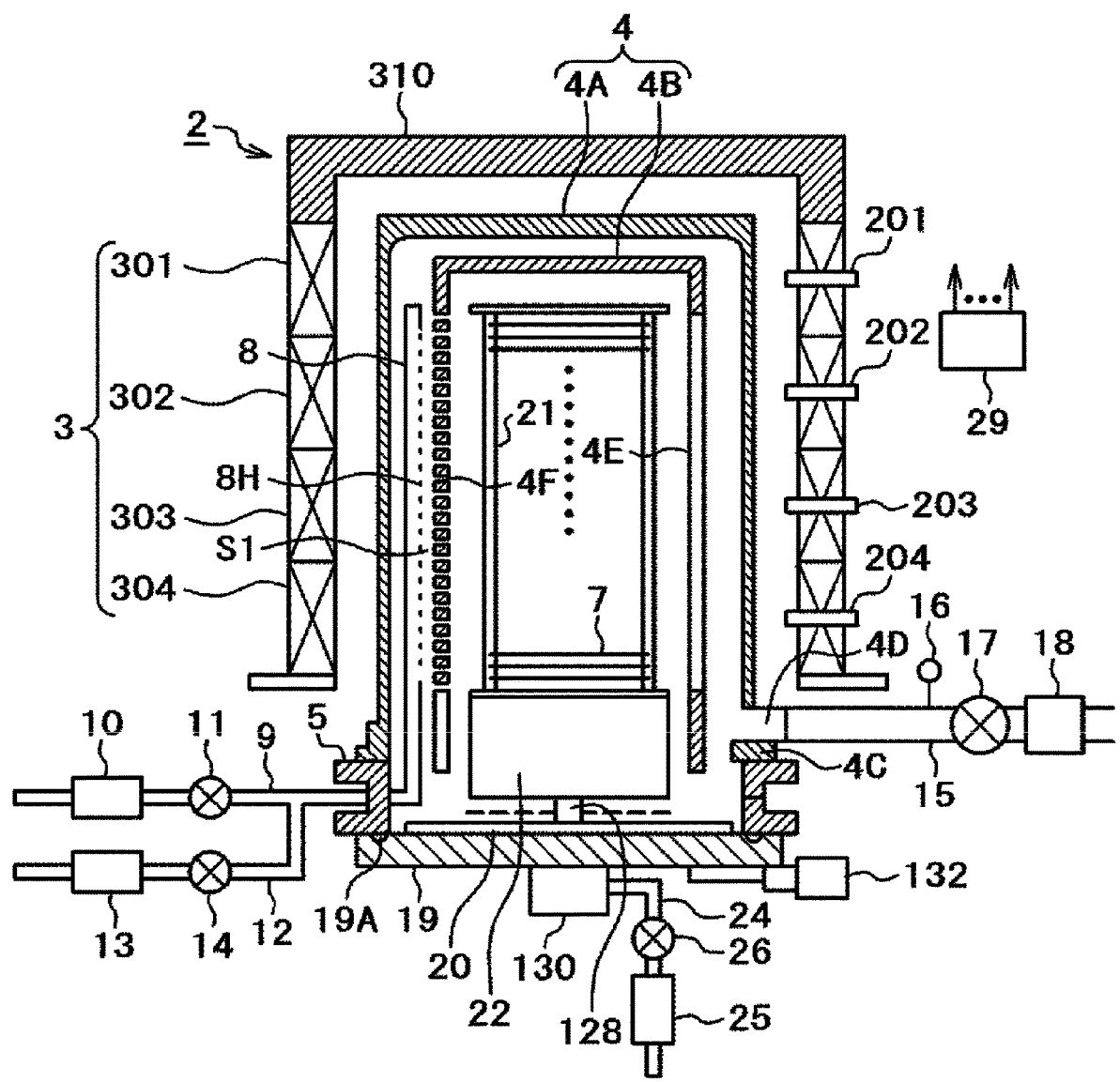
FIG. 2 is a diagram schematically illustrating a cross-section of a process furnace when a boat is elevated and accommodated in a reaction tube of the vertical type substrate processing apparatus according to the first embodiment described herein.

As shown in FIG. 2, a controller 29 is connected to the rotator 130, the boat elevator 132, the substrate transfer device 156, the gas supply structure 134 provided with the MFCs 10 and 13 and the valves 11 and 14, the APC valve 17, a clean air supply structure (not shown) and a transfer chamber gas supply structure (not shown) provided with an MFC (not shown) and a valve (not shown) shown in FIG. 1. The controller 29 is configured to be capable of controlling the components described above connected thereto. For example, the controller 29 is constituted by a microprocessor (computer) including a CPU (Central Processing Unit), and is configured to be capable of controlling operations of the processing apparatus 1.

The process furnace 2 includes the heater 3 serving as a main heater arranged along the vertical direction in order to heat a cylinder of the reaction tube 4 described later. For example, the heater 3 is of a cylindrical shape, and is arranged along the vertical direction in the cylinder of the reaction tube 4 (which is a side portion of the reaction tube 4 in the present embodiment) of the reaction tube 4. The heater 3 is constituted by a plurality of heater structures divided along the vertical direction. The heater 3 may be provided outside the reaction tube 4 to surround the reaction tube 4. According to present embodiment, the heater 3 may include an upper heater 301, a center upper heater 302, a center lower heater 303 and a lower heater 304 in this order from an upper side to a lower side of the heater 3. The heater 3 is installed perpendicular to an installation floor of the processing apparatus 1 while being supported by a heater base (not shown) serving as a support plate. Each temperature of the upper heater 301, the center upper heater 302, the center lower heater 303 and the lower heater 304 is controlled independently.

The reaction tube 4 constituting a reaction vessel (which is a process vessel) is provided on an inner side of the heater 3. The reaction tube 4 is of a cylindrical shape with an open lower end and a closed upper end. The reaction tube 4 is embodied by a double tube structure including an outer tube 4A and the inner tube 4B that are coupled to each other at a flange 4C provided at the lower end of the reaction tube 4. In other words, each of the outer tube 4A and the inner tube 4B is of a cylindrical shape, and the inner tube 4B is provided inside the outer tube 4A.

The flange 4C is provided below the outer tube 4A. An outer diameter of the flange 4C is greater than that of the outer tube 4A. The flange 4C protrudes outward from an outer periphery of the outer tube 4A. An exhaust outlet 4D communicating with an inside of the outer tube 4A is provided in the vicinity of the lower end of the reaction tube 4. The reaction tube 4 including the above described components such as the outer tube 4A and the inner tube 4B is formed as a single body of a single material. The outer tube 4A is relatively thick so as to withstand a pressure difference when the inside thereof is exhausted to vacuum.

The manifold 5 of a cylindrical shape or of a truncated cone shape is made of a metal or quartz, and is provided to support the lower end of the reaction tube 4. An inner diameter of the manifold 5 is greater than an inner diameter of the reaction tube 4 (and an inner diameter of the flange 4C). Thereby, an annular space described later is defined between the lower end of the reaction tube 4 (that is, the flange 4C) and the lid 19. The annular space and/or components surrounding the annular space may be collectively referred to as a "furnace opening".

The inner tube 4B is provided with a main exhaust port 4E and a plurality of supply slits 4F. The main exhaust port 4E is provided at the inner tube 4B closer to a center of the reaction tube 4 than the exhaust outlet 4D. The main exhaust port 4E is configured to communicate with an inside and an outside of the inner tube 4B on a side thereof. The plurality of supply slits 4F are provided at the inner tube 4B at positions opposite to the main exhaust port 4E. The main exhaust port 4E may be a single vertically elongated opening that opens to a region where the substrates 7 are disposed, or may be a plurality of slits extending in a circumferential direction of the inner tube 4B (see FIG. 1). Each of the supply slits 4F is a slit extending in the circumferential direction of the inner tube 4B. The plurality of supply slits 4F are arranged in the vertical direction so as to face each of the substrates 7.

In a gas supply space S1 between the outer tube 4A and the inner tube 4B, one or more nozzles including the nozzle 8 through which a process gas such as the source gas is supplied are provided at locations corresponding to the positions of the plurality of supply slits 4F. One or more gas supply pipes including the gas supply pipe 9 through which a process gas such as the source gas is supplied are connected to the one or more nozzles including the nozzle 8 through the manifold 5, respectively.

The process gas supplied through the nozzle 8 to an exhaust space S between the outer tube 4A and the inner tube 4B flows the inside of the inner tube 4B through the plurality of supply slits 4F while being heated by the heater 3, and flows from one end to the other end of each substrate 7 parallel to surfaces of the substrates 7 through a gap between the substrates 7 (in a case of an uppermost substrate among the substrates 7, a gap with the top plate 21a). The process gas flowing parallel to the surfaces of the substrates 7 flows from the main exhaust port 4E of the inner tube 4B to the exhaust space S between the outer tube 4A and the inner tube 4B, and is exhausted through the exhaust outlet 4D.

One or a plurality of gas supply holes 8H through which a gas such as the process gas is supplied are provided on a side surface or an upper end of the nozzle 8. The plurality of gas supply holes 8H are opened corresponding to the openings of the supply slits 4F, respectively, so as to face the center of the reaction tube 4. Thereby, it is possible to eject the gas toward the substrates 7 through the plurality of gas supply holes 8H and the inner tube 4B.

The exhaust pipe 15 through which the inner atmosphere of the reaction tube 4 is exhausted is connected to the exhaust outlet 4D. As described above, the vacuum pump 18 serving as a vacuum exhaust apparatus is connected to the exhaust pipe 15 through the pressure sensor 16 serving as a pressure detector (which is a pressure meter) to detect the inner pressure of the reaction tube 4 and the APC (Automatic Pressure Controller) valve 17 serving as a pressure regulator (which is a pressure regulating structure). With the vacuum pump 18 in operation, the APC valve 17 may be opened or closed to exhaust (vacuum-exhaust) the inner atmosphere of the reaction tube 4 or stop the vacuum exhaust. With the vacuum pump 18 in operation, an opening degree of the APC valve 17 may be adjusted based on pressure information detected by the pressure sensor 16, in order to control the inner pressure of the reaction tube 4. An exhauster (which is an exhaust system) is constituted mainly by the exhaust pipe 15, the APC valve 17 and the pressure sensor 16. The exhauster may further include the vacuum pump 18.

A cover plate 20 is provided on the upper surface of the lid 19 so as to protect a portion of the lid 19 inner than an inner periphery of the lower end of the manifold 5. The cover plate 20 is made of a heat and corrosion resistant material such as quartz, sapphire and SiC, and is of a disk shape. Since it is possible for the cover plate 20 to retain small mechanical strength, the cover plate 20 may be formed with a small thickness. In addition, the cover plate 20 is not limited to a component prepared independently of the lid 19. For example, the cover plate 20 may be embodied by a film or a layer such as a nitride film coated on the upper surface of the lid 19 and a nitride film formed by modifying the surface of the lid 19. The cover plate 20 may further include a wall extending upward along an inner surface of the manifold 5 from a circumferential edge of the cover plate 20.

The boat 21 serving as a substrate retainer may be accommodated in the inner tube 4B of the reaction tube 4. The boat 21 includes the plurality of support columns 21b installed vertically and the top plate 21a of a disk shape configured to fix upper ends of the plurality of support columns 21b to each other. According to the present embodiment, the top plate 21a of the boat 21 is an example of a top plate. In addition, according to the present embodiment, the boat 21 includes the bottom plate 21c of a ring shape at lower ends of the plurality of support columns 21b. However, instead of the bottom plate 21c of a ring shape, a bottom plate of a disk shape may be provided.

It is preferable to minimize an inner diameter of the inner tube 4B of the reaction tube 4 as long as the boat 21 can be safely transferred into and out of the reaction tube 4.

The heat insulator (which is a heat insulating structure) 22 is disposed below the boat 21. The heat insulator 22 is embodied by a structure in which conduction or transmission of the heat tends to reduce in the vertical direction, and usually a cavity is provided in the heat insulator 22. It is possible to purge an inside of the heat insulator 22 with a shaft purge gas. An upper portion of the reaction tube 4 where the boat 21 is disposed may be referred to as a process region A of the substrate 7, and a lower portion of the reaction tube 4 where the heat insulator 22 is disposed may be referred to as a heat insulating region B.

The rotator 130 configured to rotate the boat 21 is provided at the lid 19 opposite to the reaction tube 4. A gas supply pipe 24 of the shaft purge gas is connected to the rotator 130. An MFC 25 and a valve 26 are sequentially installed at the gas supply pipe 24 in this order from an upstream side to a downstream side of the gas supply pipe 24. One purpose of the shaft purge gas is to protect an inside of the rotator 130 (for example, bearings) from the gas such as a corrosive gas used in the reaction tube 4. The shaft purge gas is discharged from the rotator 130 along the rotating shaft 128 and is guided into the heat insulator 22.

The boat elevator 132 is provided outside the reaction tube 4 to be vertically below the reaction tube 4. The boat elevator 132 serves as an elevating structure (or a transfer device) capable of elevating and lowering the lid 19. When the lid 19 is moved upward or downward by the boat elevator 132, the boat 21 supported by the lid 19 and the substrates 7 accommodated in the boat 21 may be transferred into or out of the reaction tube 4. There may be provided a shutter (not shown) configured to, instead of the lid 19, close the lower end opening of the reaction tube 4 while the lid 19 is being lowered to a lowest position thereof.

Figure 3:
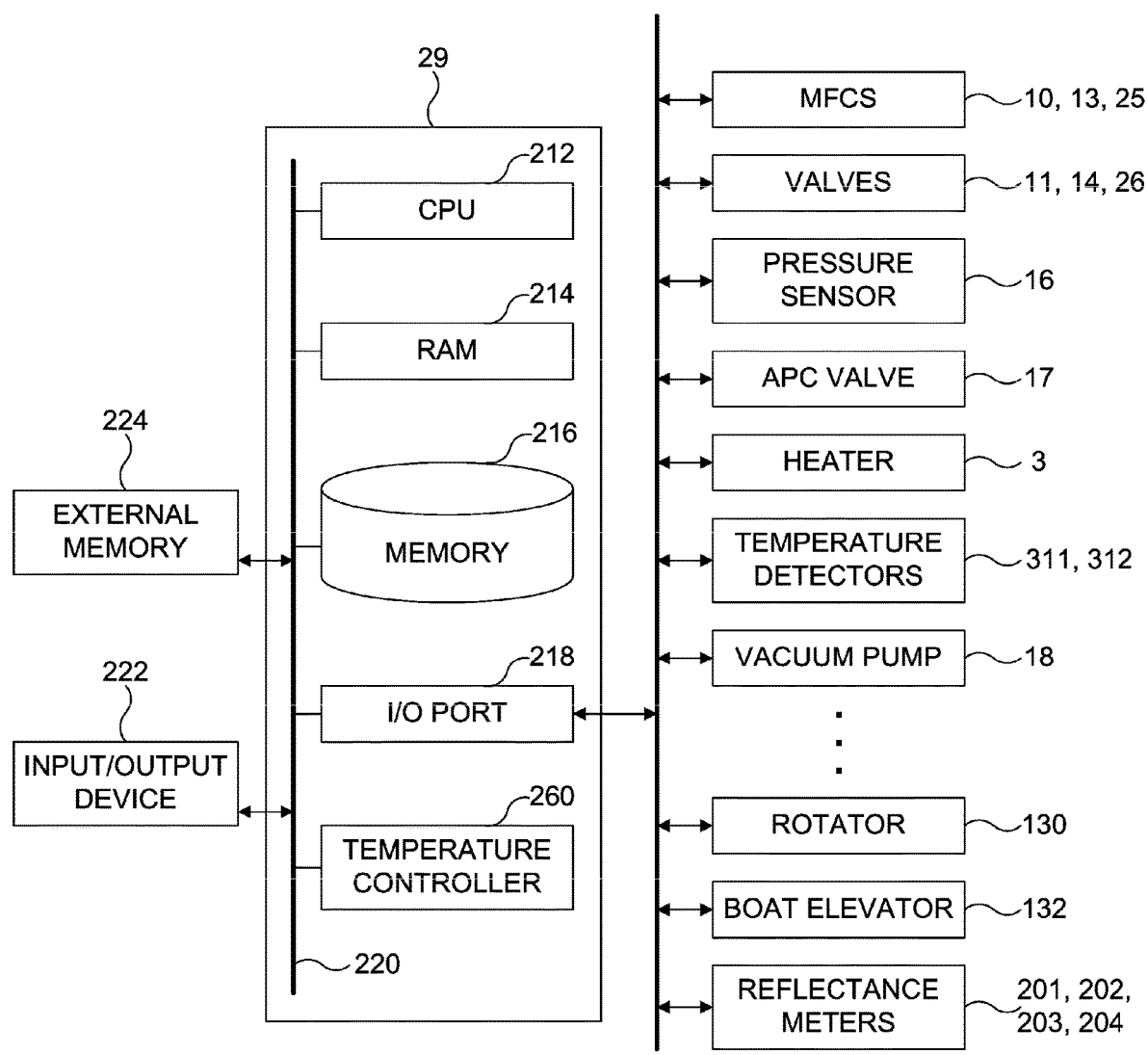
FIG. 3 is a block diagram schematically illustrating a configuration of a controller of the vertical type substrate processing apparatus according to the first embodiment described herein.

As shown in FIG. 3, the controller 29 is electrically connected to the components of the substrate processing apparatus 1 such as the MFCs 10, 13 and 25, the valves 11, 14 and 26, the pressure sensor 16, the APC valve 17, the vacuum pump 18, the rotator 130, the boat elevator 132 and reflectance meters 201, 202, 203 and 204, and is configured to automatically control the components electrically connected thereto. The controller 29 is electrically connected to the components of the substrate processing apparatus 1 such as the heater 3 (that is, the upper heater 301, the center upper heater 302, the center lower heater 303 and the lower heater 304) and temperature sensors (also referred to as temperature detectors) 311 and 312, and is configured to automatically control the heater 3.

The controller 29 is constituted by a computer including a CPU (Central Processing Unit) 212, a RAM (Random Access Memory) 214, a memory 216 and an I/O port 218. The RAM 214, the memory 216 and the I/O port 218 may exchange data with the CPU 212 through an internal bus 220. The I/O port 218 is connected to the components described above. For example, an input/output device 222 such as a touch panel and an external memory 224 are connected to the controller 29.

The memory 216 is configured by a component such as a flash memory and a hard disk drive (HDD). For example, a control program for controlling the operations of the substrate processing apparatus 1 or a program (for example, a recipe such as a process recipe and a cleaning recipe) configured to control the components of the substrate processing apparatus 1 according to the process conditions to perform the substrate processing such as a film-forming process may be readably stored in the memory 216. The RAM 214 functions as a memory area (work area) where a program or data read by the CPU 212 is temporarily stored.

The CPU 212 is configured to read the control program from the memory 216 and execute the read control program. In addition, the CPU 212 is configured to read the recipe from the memory 216 in accordance with an operation command inputted from the input/output device 222. According to the contents of the read recipe, the CPU 212 is configured to be capable of controlling the components of the substrate processing apparatus 1.

The controller 29 may be embodied by installing the above-described program continuously stored in the external memory 224 into a computer. For example, the external memory 224 may include a semiconductor memory such as a USB memory and a memory card, an optical disk such as a CD and a DVD and a hard disk drive (HDD). The memory 216 or the external memory 224 may be embodied by a non-transitory tangible computer-readable recording medium. Hereafter, the memory 216 and the external memory 224 may be collectively or individually referred to as "recording medium". Instead of the external memory 224, a communication means such as the Internet and a dedicated line may be used for providing the program to the computer.

The controller 29 is configured to manage a usage history of each dummy substrate. That is, for each of the dummy substrates, a history of being held by the substrate retainer and processed together with a product substrate is managed as an accumulative value of a thickness of a film. Then, when the accumulative value exceeds a specified value, a predetermined recording operation, a reporting operation or an operation of removing the dummy substrate from the substrate retainer may be performed.

(2) Substrate Processing (Film-Forming Step)

Figure 4:
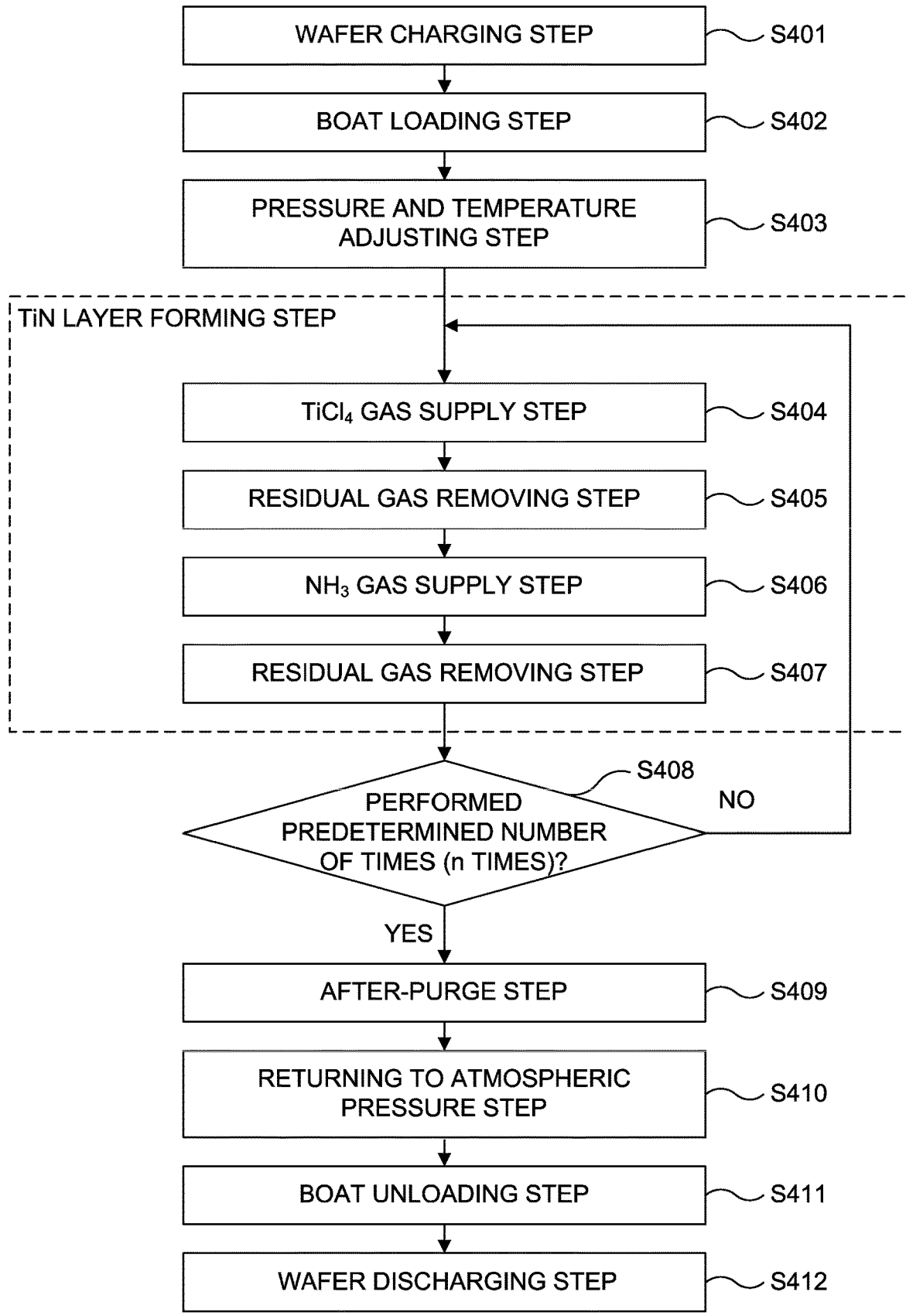
FIG. 4 is a flow chart schematically illustrating a sequence of a substrate processing of the vertical type substrate processing apparatus according to the first embodiment described herein.

With reference to FIG. 4, a step of forming a titanium nitride layer (TiN layer), which is an example of a step of forming a metal film on the substrate 7 and serving as a part of the manufacturing processes of the semiconductor device, will be described. The step of forming the metal film such as the TiN layer is performed in the reaction tube 4 of the substrate processing apparatus 1 described above. As described above, the manufacturing processes are performed by executing the program by the CPU 212 of the controller 29 as shown in FIG. 3.

The substrate processing (that is, the manufacturing processes of the semiconductor device) according to the present embodiment may include: (a) a step of supplying $TiCl_4$ gas to the substrate 7 accommodated in the reaction tube 4; (b) a step of removing a residual gas in the reaction tube 4; (c) a step of supplying $NH_3$ gas to the substrate 7 accommodated in the reaction tube 4; and (d) a step of removing the residual gas in the reaction tube 4. By repeatedly performing the steps (a) through (d) described above a plurality of times, the TiN layer is formed on the substrate 7.

In the present specification, the term "wafer" may refer to "a wafer itself" or may refer to "a wafer and a stacked structure (aggregated structure) of predetermined layers or films formed on a surface of the wafer". That is, the term "wafer" may collectively refer to the wafer and the layers or the films formed on the surface of the wafer. In addition, in the present specification, the term "a surface of a wafer" may refer to "a surface (exposed surface) of a wafer itself" or may refer to "a surface of a predetermined layer or a film formed on the wafer, i.e. a top surface (uppermost surface) of the wafer as the stacked structure". In the present specification, the terms "substrate" and "wafer" may be used as substantially the same meaning.

Wafer Charging Step and Boat Loading Step

After the substrates 7 are charged (transferred) into the boat 21 (wafer charging step S401), as shown in FIG. 1, the boat 21 charged with the substrates 7 is elevated by the boat elevator 132 and loaded (transferred) into the reaction tube 4 (boat loading step S402). With the boat 21 loaded, the lid 19 seals the lower end opening of the reaction tube 4 via the seal 19A such as an O-ring.

Pressure and Temperature Adjusting Step

The vacuum pump 18 vacuum-exhausts the inner atmosphere of the reaction tube 4 until the inner pressure of the reaction tube 4 reaches and is maintained at a desired pressure (vacuum degree). The inner pressure of the reaction tube 4 is measured by the pressure sensor 16, and the APC valve 17 is feedback-controlled based on measured pressure information (pressure adjusting step). The vacuum pump 18 continuously vacuum-exhausts the inner atmosphere of the reaction tube 4 until at least the processing of the substrate 7 is completed. The heater 3 heats the reaction tube 4 until an inner temperature of the reaction tube 4 reaches and is maintained at a desired temperature. The amount of the current supplied to the heater 3 is feedback-controlled based on temperature information detected by the temperature sensors 311 and 312 serving as temperature detectors such that a desired temperature distribution of the inner temperature of the reaction tube 4 is obtained (temperature adjusting step S403). The heater 3 continuously heats the reaction tube 4 until at least the processing of the substrate 7 is completed.

TiN Layer Forming Step

Subsequently, the step of forming the TiN layer such as a metal nitride layer serving as a first metal layer is performed.

$TiCl_4$ Gas Supply Step S404

The valve 11 for the $TiCl_4$ gas is opened to supply the $TiCl_4$ gas serving as the source gas into the gas supply pipe 9 for the $TiCl_4$ gas. A flow rate of the $TiCl_4$ gas supplied into the gas supply pipe 9 for the $TiCl_4$ gas is adjusted by the MFC 10 for the $TiCl_4$ gas. The $TiCl_4$ gas whose flow rate is adjusted is then supplied into the reaction tube 4 through the plurality of gas supply holes 8H of the nozzle 8 for the $TiCl_4$ gas, and is exhausted through the exhaust pipe 15. Thereby, the $TiCl_4$ gas is supplied to the substrates 7. In parallel with the supply of the $TiCl_4$ gas, the valve 14 related to the gas supply pipe 9 for the $TiCl_4$ gas is opened to supply the inert gas such as the $N_2$ gas into the gas supply pipe 12 related to the gas supply pipe 9 for the $TiCl_4$ gas. A flow rate of the $N_2$ gas supplied into the gas supply pipe 12 related to the gas supply pipe 9 for the $TiCl_4$ gas is adjusted by the MFC 13 related to the gas supply pipe 9 for the $TiCl_4$ gas. The $N_2$ gas whose flow rate is adjusted is then supplied into the reaction tube 4 together with the $TiCl_4$ gas, and is exhausted through the exhaust pipe 15.

The $N_2$ gas is supplied into the reaction tube 4 through the gas supply pipe 12 related to the gas supply pipe 9 for the $TiCl_4$ gas and the nozzle 8 for the $TiCl_4$ gas, and is exhausted through the exhaust pipe 15. When the $N_2$ gas is supplied, for example, a temperature of the heater 3 is set such that the temperature of the substrate 7 reaches and is maintained at a temperature ranging from 250° C. to 550° C.

In the $TiCl_4$ gas supply step S404, the $TiCl_4$ gas and the $N_2$ gas are supplied into the reaction tube 4 without any other gas being supplied into the reaction tube 4 together with the $TiCl_4$ gas and the $N_2$ gas. By supplying the $TiCl_4$ gas, a titanium-containing layer whose thickness is, for example, within a range from less than a single atomic layer to several atomic layers is formed on the substrate 7 (that is, on a base film on a surface of the substrate 7).

Residual Gas Removing Step S405

After the titanium-containing layer is formed on the surface of the substrate 7 by supplying the $TiCl_4$ gas into the reaction tube 4 for a predetermined time, the valve 11 for the $TiCl_4$ gas is closed to stop the supply of the $TiCl_4$ gas. In the residual gas removing step S405, with the APC valve 17 of the exhaust pipe 15 open, the vacuum pump 18 vacuum-exhausts the inner atmosphere of the reaction tube 4 to remove a residual gas in the reaction tube 4 such as the $TiCl_4$ gas which did not react or which contributed to the formation of the titanium-containing layer out of the reaction tube 4. In the residual gas removing step S405, with the valve 14 related to the gas supply pipe 9 for the $TiCl_4$ gas open, the $N_2$ gas is continuously supplied into the reaction tube 4. The $N_2$ gas serves as a purge gas, which improves the efficiency of removing the residual gas in the reaction tube 4 such as the $TiCl_4$ gas which did not react or which contributed to the formation of the titanium-containing layer out of the reaction tube 4.

$NH_3$ Gas Supply Step S406

After the residual gas in the reaction tube 4 is removed from the reaction tube 4, the valve 11 for the $NH_3$ gas is opened to supply a nitrogen-containing gas such as the $NH_3$ gas serving as the reactive gas into the gas supply pipe 9 for the $NH_3$ gas. A flow rate of the $NH_3$ gas supplied into the gas supply pipe 9 for the $NH_3$ gas is adjusted by the MFC 10 for the $NH_3$ gas. The $NH_3$ gas whose flow rate is adjusted is then supplied into the reaction tube 4 through the plurality of gas supply holes 8H of the nozzle 8 for the $NH_3$ gas, and is exhausted through the exhaust pipe 15. Thereby, the $NH_3$ gas is supplied to the wafers including the substrate 7. In the $NH_3$ gas supply step S406, the valve 14 related to the gas supply pipe 9 for the $NH_3$ gas is closed in order to prevent the $N_2$ gas from being supplied into the reaction tube 4 together with the $NH_3$ gas. That is, the $NH_3$ gas is supplied into the reaction tube 4 without being diluted with the $N_2$ gas, and is exhausted through the exhaust pipe 15.

In parallel with the supply of the $NH_3$ gas, in order to prevent the $NH_3$ gas from entering the nozzle 8 for the $TiCl_4$ gas, the valve 14 related to the gas supply pipe 9 for the $TiCl_4$ gas is opened to supply the $N_2$ gas into the gas supply pipe 12 related to the gas supply pipe 9 for the $TiCl_4$ gas. The $N_2$ gas is supplied into the reaction tube 4 through the gas supply pipe 12 related to the gas supply pipe 9 for the $TiCl_4$ gas and the nozzle 8 for the $TiCl_4$ gas, and is exhausted through the exhaust pipe 15. In the $NH_3$ gas supply step S406, the $NH_3$ gas serving as the reactive gas is supplied into the reaction tube 4 without being diluted with the $N_2$ gas. Thus, it is possible to improve a film-forming rate of the TiN layer. It is also possible to adjust an atmosphere concentration of the $N_2$ gas in the vicinity of the substrates 7. In the $NH_3$ gas supply step S406, the temperature of the heater 3 is set to the same temperature as that of the $TiCl_4$ gas supply step S404.

In the $NH_3$ gas supply step S406, the $NH_3$ gas and the $N_2$ gas are supplied into the reaction tube 4 without any other gas being supplied into the reaction tube 4 together with the $NH_3$ gas and the $N_2$ gas. A substitution reaction occurs between the $NH_3$ gas and at least a portion of the titanium-containing layer formed on the substrate 7 in the $TiCl_4$ gas supply step S404. During the substitution reaction, titanium (Ti) contained in the titanium-containing layer and nitrogen (N) contained in the $NH_3$ gas are bonded. As a result, the TiN layer containing titanium and nitrogen is formed on the substrate 7.

Residual Gas Removing Step S407

After the TiN layer is formed, the valve 11 for the $NH_3$ gas is closed to stop the supply of the $NH_3$ gas. Then, a residual gas in the reaction tube 4 such as the $NH_3$ gas which did not react or which contributed to the formation of the TiN layer and reaction byproducts are removed out of the reaction tube 4 in the same manners as in the residual gas removing step S405.

Performing a Predetermined Number of Times

By performing a cycle wherein the step S404 through the step S407 described above are sequentially performed in this order at least once (that is, a predetermined number of times (n times)) (S408), the TiN layer of a predetermined thickness (for example, 0.1 nm to 2 nm) is formed on the substrate 7. It is preferable that the cycle described above is repeatedly performed a plurality of times, for example, preferably about 10 times to 80 times, and more preferably about 10 times to 15 times.

After-Purge Step and Returning to Atmospheric Pressure Step

The $N_2$ gas is supplied into the reaction tube 4 through each of the gas supply pipe 12 for the $TiCl_4$ gas and the gas supply pipe 12 for the $NH_3$ gas, and is exhausted through the exhaust pipe 15. The $N_2$ gas serves as the purge gas, and the inner atmosphere of the reaction tube 4 is purged with the $N_2$ gas (inert gas). Thereby, the residual gas in the reaction tube 4 or the reaction by-products remaining in the reaction tube 4 are removed from the reaction tube 4 (after-purge step S409). Thereafter, the inner atmosphere of the reaction tube 4 is replaced with the inert gas (substitution by the inert gas), and the inner pressure of the reaction tube 4 is returned to the normal pressure (atmospheric pressure) (returning to atmospheric pressure step S410).

Boat Unloading Step and Wafer Discharging Step

Thereafter, the lid 19 is lowered by the boat elevator 132 and the lower end of the reaction tube 4 is opened. The boat 21 with the processed substrates 7 charged therein is unloaded out of the reaction tube 4 through the lower end of the reaction tube 4 (boat unloading step S411). Then, the processed substrates 7 are transferred (discharged) from the boat 21 (wafer discharging step S412).

Figure 5:
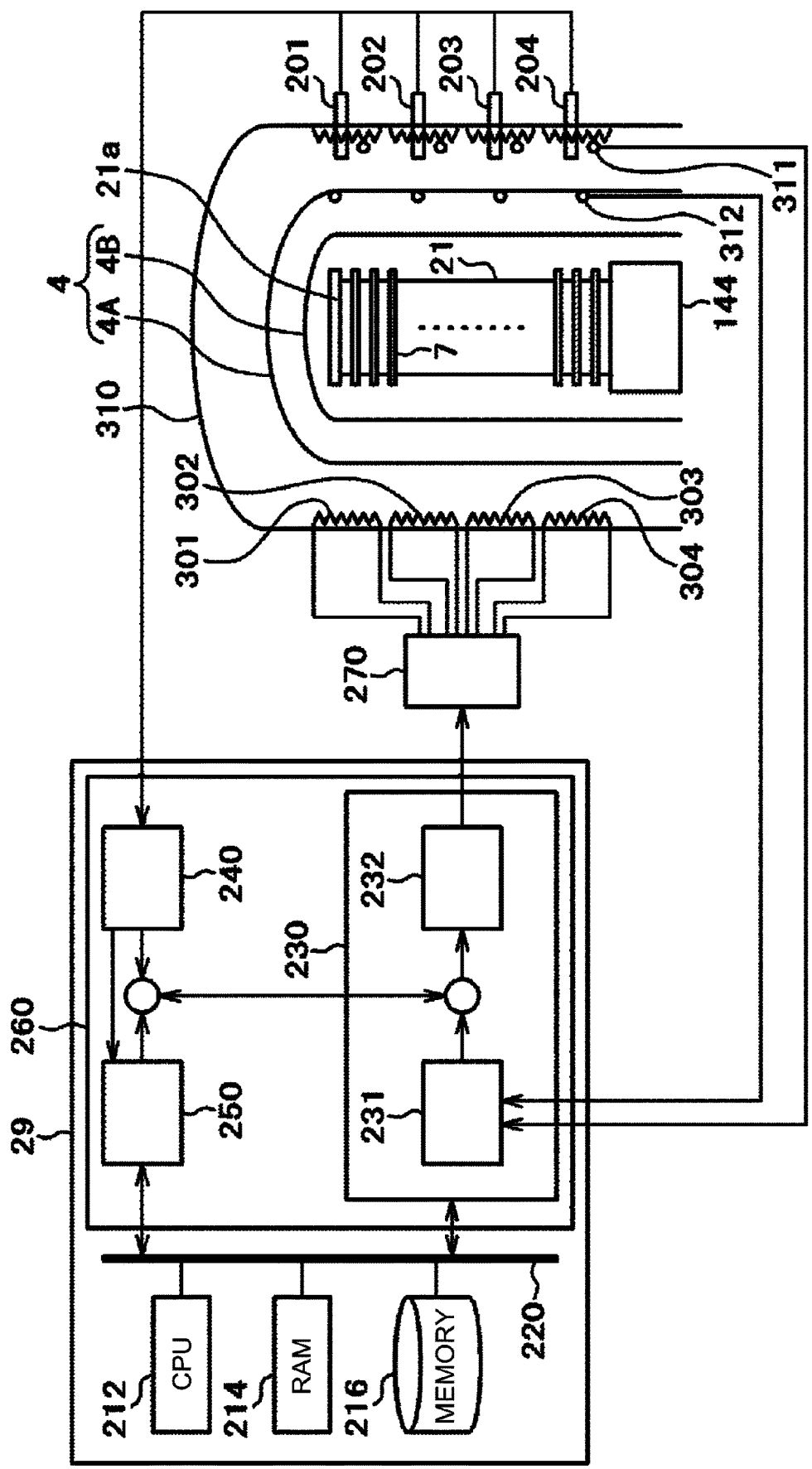
FIG. 5 is a diagram schematically illustrating configurations of a heater, a temperature detector, a reflectance detector and a temperature controller provided in the process furnace in the vertical type substrate processing apparatus according to the first embodiment described herein.

Although not shown in FIGS. 1 and 2 for simplification, as shown in FIG. 5, the process furnace 2 is provided with the temperature sensors 312 and 311 and the reflectance meters 201, 202, 203 and 204 at positions corresponding to each of the divided heater structures (that is, the upper heater 301, the center upper heater 302, the center lower heater 303 and the lower heater 304), and the temperature sensors 312 and 311 and the reflectance meters 201 through 204 are connected to the controller (which is a control structure) 29. In FIG. 5, for the sake of simplicity, the nozzle 8 through which the source gas is supplied is omitted.

The heater 3 is provided along a surface of an inner wall (also referred to as an "inner wall surface") of the process furnace 2 and divided into the plurality of heater structures, and the temperature of the heater 3 is controlled for each heater structures. In FIG. 5, an exemplary configuration of the heater 3 in which the heater is divided into four heater structures (that is, the upper heater 301, the center upper heater 302, the center lower heater 303 and the lower heater 304) is illustrated.

The temperature sensor 312 is provided at an inner side of the outer tube 4A of the reaction tube 4 at positions corresponding to the divided heater structures 301 through 304 (that is, the upper heater 301, the center upper heater 302, the center lower heater 303 and the lower heater 304), and the temperature sensor 311 is provided at the inner side of the heater 3 of the process furnace 2 at positions corresponding to the divided heater structures 301 through 304. The temperature sensor 312 installed at the inner side of the outer tube 4A is constituted by a cascade thermocouple. The temperature sensor 311 provided at the inner side of the heater 3 of the process furnace 2 at positions corresponding to the divided heater structures 301 through 304 is constituted by a heater thermocouple.

In the vicinity of central portions in a height direction of the divided heater structures, the reflectance meters 201 through 204 are installed through holes provided at the upper heater 301, the center upper heater 302, the center lower heater 303 and the lower heater 304, respectively. The reflectance meters 201 through 204 are configured to measure the reflectance of the outer tube 4A of the reaction tube 4. Although an example in which four reflectance meters are provided is shown in the present embodiment, at least one of the reflectance meters may be provided.

Temperature detection signals at a plurality of locations detected by the temperature sensor 312 constituted by the cascade thermocouple and temperature detection signals from the temperature sensor 311 constituted by the heater thermocouple and provided at the positions corresponding to the divided heater structures 301 through 304 are input to a temperature converter 231 of a temperature conversion controller 230 in a temperature controller 260 and converted into temperature information.

On the other hand, signals detected by the reflectance meters 201 through 204 are input to a reflectance detector 240 of the temperature controller 260 and converted into reflectance data. The reflectance data obtained by the reflectance detector 240 is input to an operation processor 250. In the operation processor 250, the thickness of the film attached to each portion of the inner tube 4B of the reaction tube 4 is obtained from each reflectance data obtained by each of the reflectance meters 201 through 204 using the reflectance detector 240, based on a relationship between the reflectance and the thickness of the film stored in the memory 216 in advance.

In the memory 216, a relationship between the detected temperature of the temperature sensor 312 installed at the inner side of the outer tube 4A of the reaction tube 4 and the temperature of the substrate 7 accommodated in the boat 21 of the inner tube 4B is stored as a temperature control coefficient for each thickness of the film attached to each portion of the inner side of the outer tube 4A. The temperature of the substrate 7 accommodated in the boat 21 may be measured by placing the substrate 7 to which the cascade thermocouple is attached at a predetermined position (height) of the boat 21.

In the operation processor 250, based on information on the thickness of the film attached to each portion of the outer tube 4A of the reaction tube 4 obtained from the signals detected by the reflectance meters 201 through 204, a temperature control coefficient corresponding to the thickness of the film is extracted from a plurality of temperature control coefficients stored in the memory 216. Using the extracted temperature control coefficient, the temperature information inside the outer tube 4A obtained by the temperature converter 231 from the temperature detection signals of the temperature sensor 312 is corrected to obtain an inner temperature of the outer tube 4A. A difference from a target value is calculated for each portion of the outer tube 4A. Thereby, a control target temperature for each portion of the outer tube 4A is obtained.

Figure 9B:
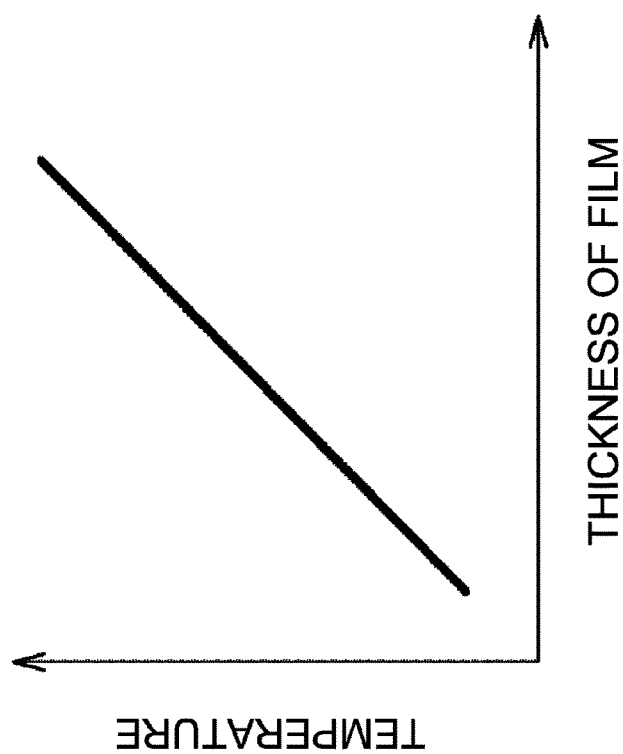
FIG. 9B is a graph schematically illustrating a relationship between the reflectance and the thickness of the film according to the first embodiment.
Figure 9A:
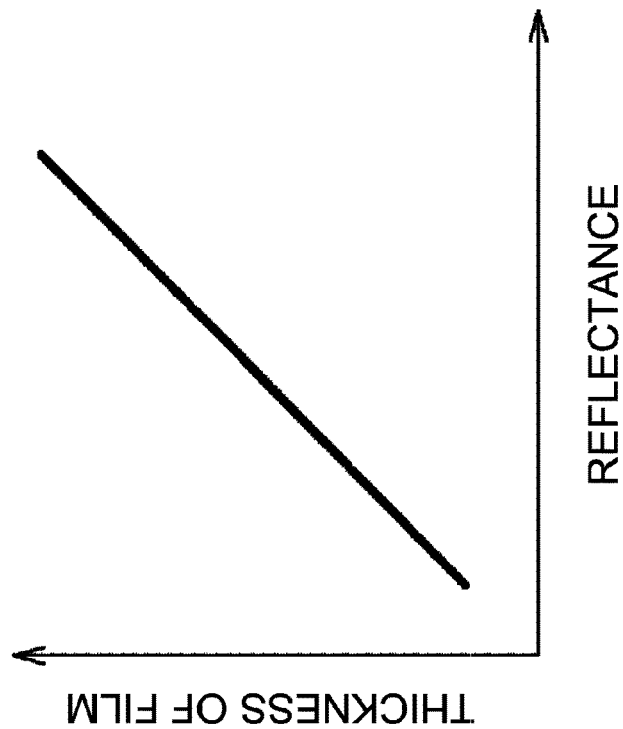
FIG. 9A is a graph schematically illustrating a relationship between a reflectance and a thickness of a film according to the first embodiment.

According to the present embodiment, the temperature control coefficient is configured to be extracted by data indicating the relationship between the reflectance and the thickness of the film measured in advance and correspondence data (correspondence table (not shown)) between the thickness of the film and the temperature control coefficient. However, the present embodiment is not limited thereto. For example, as shown in FIG. 9A, there is a relationship between the reflectance and the thickness of the film, and as shown in FIG. 9B, there is also a relationship between the thickness of the film and the temperature. As seen from the relationships shown in FIGS. 9A and 9B, there is a certain relationship between the temperature control coefficient and the reflectance (or the thickness of the film). Therefore, by storing approximate expression data of the certain relationship described above in the memory 216, the operation processor 250 may calculate (obtain) the temperature control coefficient based on the reflectance data and the approximate expression data stored in the memory 216.

A difference between the control target temperature for each portion of the outer tube 4A calculated as described above and the temperature for each portion of the outer tube 4A converted by the temperature converter 231 is input to a PID controller (Proportional Integral Differential Controller) 232, and a power signal to be applied to each of the divided heater structures 301 through 304 is generated.

The power signal generated by the PID controller 232 and applied to each of the divided heater structures 301 through 304 is input to an SCR (Silicon Control Rectifier) 270, is rectified by the SCR 270, and is input to each of the divided heater structures 301 through 304. Then, the temperature of each of the divided heater structures 301 through 304 is controlled individually.

While the heater 3 is controlled by the temperature controller 260 whose configuration is described above, the substrate processing is performed according to a process flow of FIG. 4 as described above in "(2) Substrate Processing (Film-forming Step)". Thereby, the film is formed on the surface of the substrate 7.

While the steps S404 through S407 of the substrate processing (film-forming step) are being repeatedly performed, the temperature of each of the divided heater structures 301 through 304 is feedback-controlled by the temperature controller 260 individually using the power signal to be applied to each of the divided heater structures 301 through 304 via the SCR 270, wherein the PID controller 232 generates the power signal to be applied to each of the divided heater structures 301 through 304 based on the temperature difference for each portion calculated based on (i) the control target temperature for each portion of the outer tube 4A calculated using the reflectance data of a surface of a wall (also referred to as a "wall surface") of the outer tube 4A of the reaction tube 4 detected by the reflectance meters 201 through 204 and (ii) the temperature for each portion of the outer tube 4A converted by the temperature converter 231 based on temperature data for each portion in the process furnace 2 detected by the temperature sensors 312 and 311.

By feedback-controlling the temperature of each of the divided heater structures 301 through 304 individually in real time using the reflectance data of the wall surface of the outer tube 4A of the reaction tube 4 detected by the reflectance meters 201 through 204, even when the thickness of the film formed on an inner wall surface of the reaction tube 4 is gradually increased by repeatedly performing the film-forming step, it is possible to individually control the temperature of each of the divided heater structures 301 through 304 based on data of an actual thickness of the film. As a result, it is possible to maintain film-forming conditions inside the reaction tube 4 constant, and it is also possible to stabilize the quality of the film formed on the surface of the substrate 7.

Further, in general, in order to rapidly elevate the temperature of the substrate 7 at the start of the film-forming step, the voltage applied to each of the divided heater structures 301 through 304 is set to be higher than the voltage applied to each of the divided heater structures 301 through 304 during a steady operation. However, by feedback-controlling the temperature of each of the divided heater structures 301 through 304 individually in real time using the reflectance data of the wall surface of the outer tube 4A of the reaction tube 4 detected by the reflectance meters 201 through 204, it is possible to prevent the overshoot, and it is also possible to stabilize the quality of the film formed on the surface of the substrate 7.

Further, by measuring the reflectance in real time using the reflectance data of the wall surface of the outer tube 4A of the reaction tube 4, it is possible to obtain the information on the thickness of the film attached to the inner wall surface of the outer tube 4A of the reaction tube 4, and it is also possible to determine a cleaning timing of the reaction tube 4. As a result, it is possible to prevent a decrease in a heating efficiency of each of the divided heater structures 301 through 304 due to the thickening of the film attached to the inner wall surface of the outer tube 4A of the reaction tube 4. Further, it is possible to prevent a part of the film (which is grown thick and attached to the inner wall surface of the outer tube 4A of the reaction tube 4) from peeling off and being attached to the substrate 7 accommodated in the boat 21.

According to the present embodiment, it is possible to improve a temperature variation inside the reaction tube 4 due to the increase in an accumulative thickness of the film on a wall surface of the reaction tube 4 in the substrate processing, and it is also possible to perform the substrate processing uniformly.

In addition, according to the present embodiment, it is possible to eliminate a discrepancy between a pre-set temperature elevation rate and an actual temperature elevation rate in the reaction tube 4 according to the heater output due to the increase in the accumulative thickness of the film. Thereby, it is possible to mitigate the overshoot at the start of the heating, and it is also possible to expect that a manufacturing cost of the semiconductor device can be reduced and a substrate processing efficiency can be improved.

Modified Example of First Embodiment

In the configuration shown in FIGS. 1, 2 and 5, an example in which a resistance heating type heater using the electric resistance is used as each of the divided heater structures 301 through 304 serving as the heater 3 of the process furnace 2 is described. However, each of the divided heater structures 301 through 304 may be replaced with a heater using radiation such as a lamp heater.

When the lamp heater is used as a heat source of the process furnace 2 as described above, as compared with a case in which the resistance heating type heater is used as each of the divided heater structures 301 through 304, it is possible to rapidly elevate the temperature at the start of the heating. As a result, it is possible to shorten the time from the start of the heating until the inner temperature of the reaction tube 4 reaches and is maintained at a predetermined temperature, and it is also possible to improve the throughput of the film-forming process.

When the temperature is rapidly elevated from the start of the heating by using the lamp heater as the heat source of the process furnace 2, in order to prevent the inner temperature of the reaction tube 4 from overshooting, it is preferable to perform a temperature control corresponding to the heating by the lamp heater, which is different from that of the first embodiment described above.

That is, the temperature controller 260 controls the electric power applied to the lamp heater based on a relationship between the reflectance data detected by the reflectance meters 201 through 204 and an inner temperature of the inner tube 4B of the reaction tube 4 obtained for each thickness of the film attached to the wall surface of the outer tube 4A of the reaction tube 4.

When the inner temperature of the reaction tube 4 reaches a predetermined temperature and the lamp heater is used as the heater 3 of the process furnace 2 according to the present modified example, similar to the first embodiment, while the lamp heater serving as the heater 3 are controlled by the temperature controller 260, the substrate processing is performed according to the process flow of FIG. 4 as described above in "(2) Substrate Processing (Film-forming Step)". Thereby, the film is formed on the surface of the substrate 7.

While the steps S404 through S407 of the substrate processing (film-forming step) are being repeatedly performed, a temperature of each of the lamp heater which corresponds to each of the divided heater structures 301 through 304 according to the first embodiment is feedback-controlled by the temperature controller 260 individually using the power signal to be applied to each of the lamp heater via the SCR 270, wherein the PID controller 232 generates the power signal to be applied to each of the lamp heater based on the temperature difference for each portion calculated based on (i) the control target temperature for each portion of the outer tube 4A calculated using the reflectance data of a wall surface of the outer tube 4A of the reaction tube 4 detected by the reflectance meters 201 through 204 and (ii) the temperature for each portion of the outer tube 4A converted by the temperature converter 231 based on the temperature data for each portion in the process furnace 2 detected by the temperature sensors 312 and 311.

Second Embodiment

Figure 6:
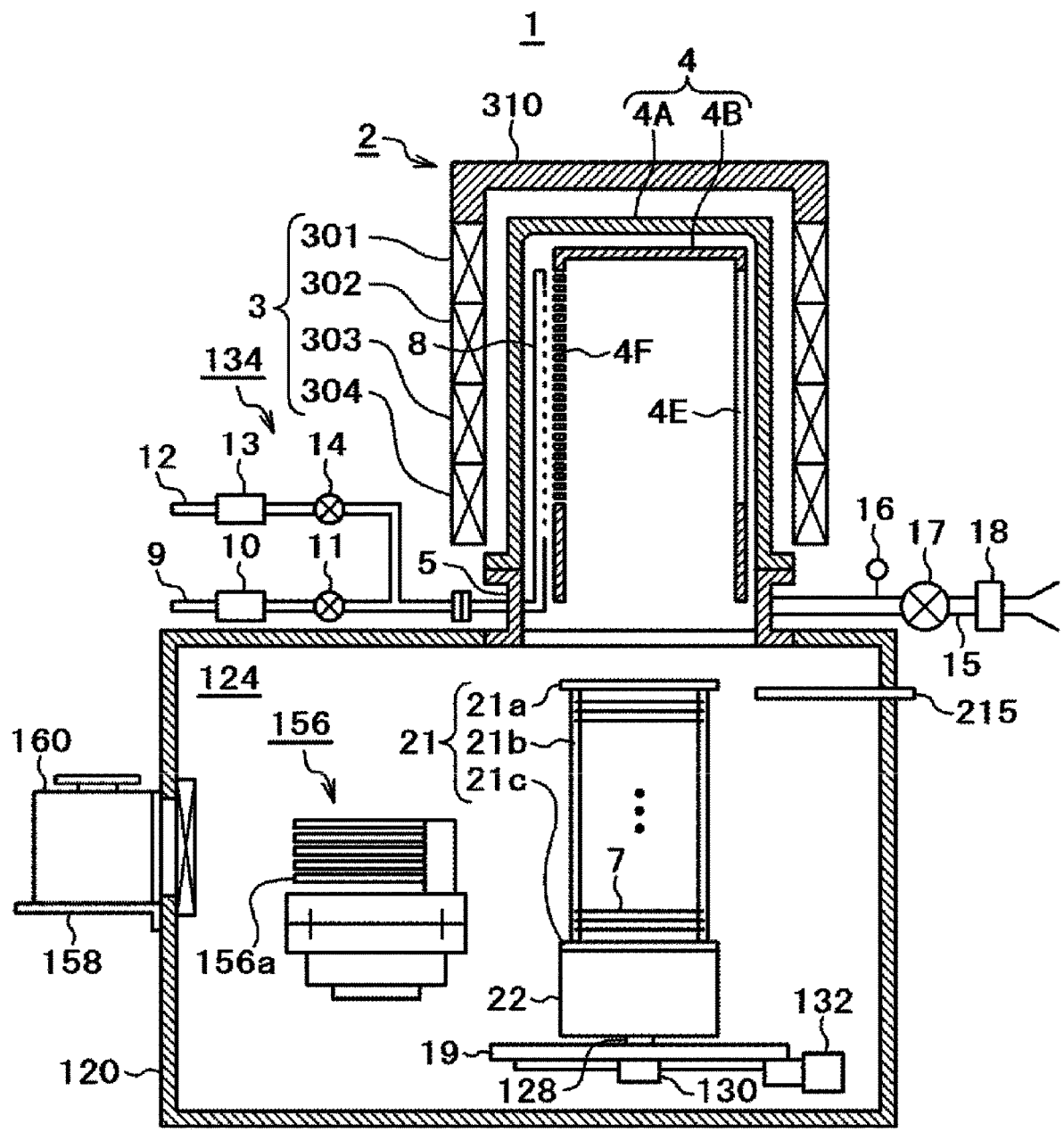
FIG. 6 is a diagram schematically illustrating a configuration of a vertical type substrate processing apparatus according to a second embodiment described herein.

The first embodiment is described by way of an example in which the reflectance meters 201 through 204 are provided at the positions corresponding to each of the divided heater structures 301 through 304 of the process furnace 2 to detect the reflectance of the wall surface of the outer tube 4A of the reaction tube 4 and the temperature of each of the divided heater structures 301 through 304 is feedback-controlled by the temperature controller 260 individually. On the other hand, according to the present embodiment, as shown in FIG. 6, when the film-forming process is completed and the boat 21 is lowered to be located in the transfer chamber 124, a reflectance of a support column among the plurality of support columns 21b of the boat 21 is measured by a reflectance meter 215 provided at the transfer chamber 124.

With such a configuration, it is possible to obtain reflectance data at each position (height direction) of the support column among the plurality of support columns 21b corresponding to the positions of the divided heater structures 301 through 304 as shown in FIG. 2 when the film-forming process is performed. Then, the reflectance data of the support column among the plurality of support columns 21b obtained as described above is input to the reflectance detector 240 of the temperature controller 260 described with reference to FIG. 5, and processed by the operation processor 250. Thereby, it is possible to obtain information on the thickness of the film at each position in the height direction of the support column among the plurality of support columns 21b.

The information on the thickness of the film at each position in the height direction of the support column among the plurality of support columns 21b obtained as described above can be used to control the output of each of the divided heater structures 301 through 304 when the boat 21 charged with subsequent substrates 7 to be processed is elevated from the transfer chamber 124 into the reaction tube 4 to perform the film-forming process.

According to the present embodiment, it is possible to obtain the information on the thickness of the film without providing reflectance meters in the process furnace 2, and it is also possible to change a temperature control parameter for the film-forming process with a simpler configuration.

In addition, when the boat 21 is lowered to be located in the transfer chamber 124, the rotating shaft 128 may be rotated by the rotator 130 to rotate the boat 21 such that the reflectance of each of the plurality of support columns 21b provided at the boat 21 can be measured by the reflectance meter 215. As a result, it is possible to obtain a plurality of data for each zone in the height direction of the plurality of support columns 21b. By controlling the divided heater structures 301 through 304 for each zone by the temperature controller 260 using an average value of each of the plurality of data for each zone, it is possible to perform the feedback control more accurately.

Modified Example of Second Embodiment

As a modified example of the second embodiment, configurations of the first embodiment and the second embodiment may be combined.

That is, according to the modified example of the second embodiment, the reflectance meters 201 through 204 as shown in FIGS. 1 and 2 described in the first embodiment are provided on a side of the heater 3 facing the process furnace 2 and the reflectance meter 215 as described in the second embodiment is provided at the transfer chamber 124.

With such a configuration, by providing the reflectance meters 201 through 204 at the divided heater structures 301 through 304, respectively, it is possible to determine the cleaning timing of the reaction tube 4 from the reflectance data of the outer tube 4A in the reaction tube 4 measured by the reflectance meters 201 through 204 when the film-forming process is performed to the substrate 7 accommodated in the boat 21. It is also possible to determine a cleaning timing of the boat 21 from the reflectance data of the support column among the plurality of support columns 21b of the boat 21 measured by the reflectance meter 215.

Third Embodiment

As a third embodiment, a configuration in which an internal state of the inner tube 4B of the reaction tube 4 can be directly monitored by a reflectance meter will be described with reference to FIG. 7.

Figure 7:
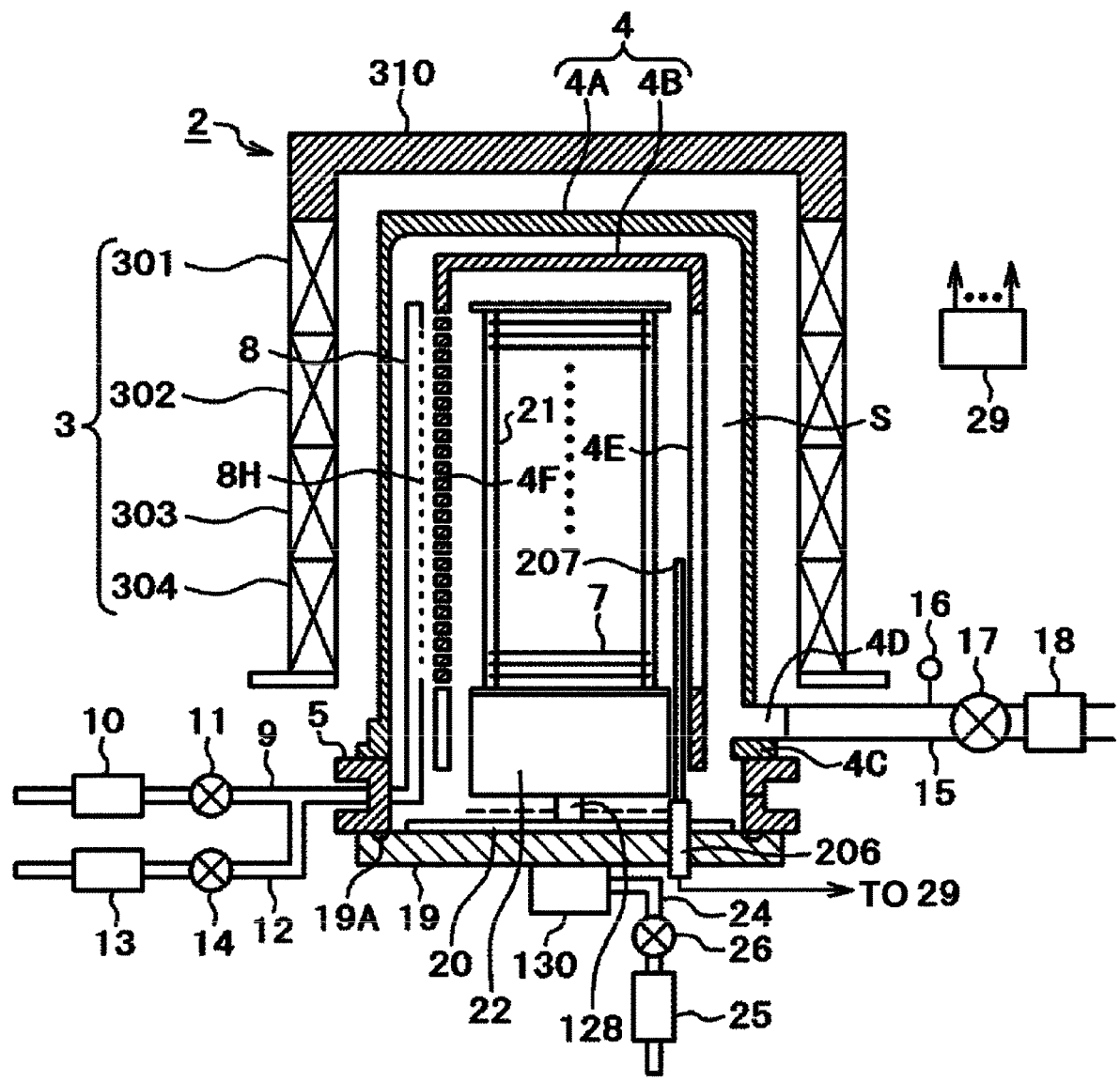
FIG. 7 is a diagram schematically illustrating a cross-section of a process furnace of a vertical type substrate processing apparatus according to a third embodiment described herein.

According to a configuration shown in FIG. 7, a reflectance meter 206 which is the same reflectance meter as described in the first embodiment and the second embodiment is fixed to the lid 19. According to the present embodiment, a reflectance monitor is constituted by the reflectance meter 206 and a quartz pipe 207 attached to a front end portion thereof. A front end portion of the quartz pipe 207 is disposed to be inside of the inner tube 4B.

In FIG. 7, a set of a combination of the reflectance meter 206 and the quartz pipe 207 is illustrated. However, a plurality of sets (4 sets in a case of the configuration shown in FIG. 7) of the combination are provided. A length of the quartz pipe 207 of each set is set to a length corresponding to a substantially central position in the height direction of each of the divided heater structures 301 through 304. Further, also in the present embodiment, the temperature sensors 311 and 312 as described with reference to FIG. 5 in the first embodiment are provided.

When the film is formed on the surface of the substrate 7 accommodated in the boat 21 in the inner tube 4B, the film is also formed on the front end portion of the quartz pipe 207, and a reflectance of the front end portion of the quartz pipe 207 detected by the reflectance meter 206 may change according to a thickness of the film formed on the front end portion of the quartz pipe 207. By monitoring the change in the reflectance of the front end portion of the quartz pipe 207 by the reflectance meter 206, it is possible to estimate a film-forming state on the surface of the substrate 7 accommodated in the boat 21 by the procedure as described in the first embodiment. By using information on the change in the reflectance of the film attached to the front end portion of the quartz pipe 207, while the steps S404 through S407 of the substrate processing (film-forming step) are being repeatedly performed as described in the first embodiment, the temperature of each of the divided heater structures 301 through 304 is feedback-controlled by the temperature controller 260 individually based on the power signal to be applied to each of the divided heater structures 301 through 304 via the SCR 270, wherein the PID controller 232 generates the power signal to be applied to each of the divided heater structures 301 through 304 based on the temperature difference for each portion calculated based on: (i) the control target temperature calculated using reflectance data of the front end portion of the quartz pipe 207 detected by the reflectance meter 206; and (ii) the temperature for each portion of the outer tube 4A converted by the temperature converter 231 based on the temperature data for each portion in the process furnace 2 detected by the temperature sensors 312 and 311.

As described above, by feedback-controlling the temperature of each of the divided heater structures 301 through 304 individually in real time using the reflectance data of the film attached to the front end portion of the quartz pipe 207 at an inner side of the inner tube 4B of the reaction tube 4 detected by the reflectance meter 206, even when the thickness of the film formed on the inner wall surface of the reaction tube 4 is gradually increased by repeatedly performing the film-forming step, it is possible to individually control the temperature of each of the divided heater structures 301 through 304. As a result, it is possible to maintain the film-forming conditions inside the reaction tube 4 constant, and it is also possible to stabilize the quality of the film formed on the surface of the substrate 7.

Further, in general, in order to rapidly elevate the temperature of the substrate 7 at the start of the film-forming step, the voltage applied to each of the divided heater structures 301 through 304 is set to be higher than the voltage applied to each of the divided heater structures 301 through 304 during a steady operation. However, by feedback-controlling the temperature of each of the divided heater structures 301 through 304 individually in real time using the reflectance data of the film attached to the front end portion of the quartz pipe 207 at the inner side of the inner tube 4B of the reaction tube 4 detected by the reflectance meter 206, it is possible to prevent the overshoot, and it is also possible to stabilize the quality of the film formed on the surface of the substrate 7.

Further, by measuring the reflectance in real time using the reflectance data of the film attached to the front end portion of the quartz pipe 207 at the inner side of the inner tube 4B of the reaction tube 4, it is possible to obtain the information on the thickness of the film attached to the inner wall surface of the outer tube 4A of the reaction tube 4, and it is also possible to determine the cleaning timing of the reaction tube 4. As a result, it is possible to prevent the decrease in the heating efficiency of each of the divided heater structures 301 through 304 due to the thickening of the film attached to the inner wall surface of the outer tube 4A of the reaction tube 4. Further, it is possible to prevent a part of the film (which is grown thick and attached to the inner wall surface of the outer tube 4A of the reaction tube 4) from peeling off and being attached to the substrate 7 accommodated in the boat 21.

Fourth Embodiment

As a fourth embodiment, in addition to the configuration described in the first embodiment, a configuration in which a temperature measurement substrate 71 provided with a thermocouple attached to a surface thereof is used in the substrate 7 accommodated in the boat 21 will be described.

Figure 8:
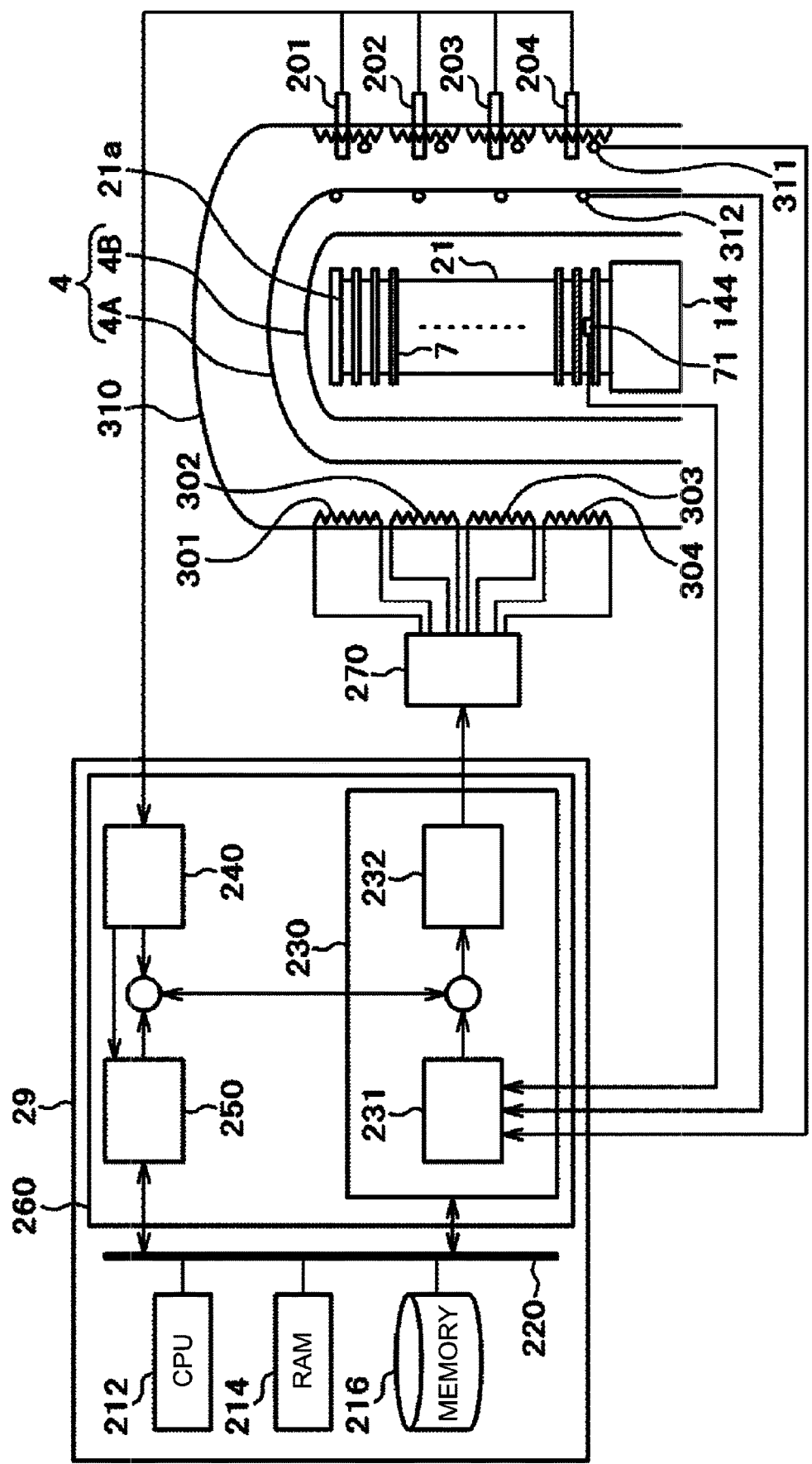
FIG. 8 is a diagram schematically illustrating configurations of a heater, a temperature detector, a reflectance detector and a temperature controller provided in a process furnace in a vertical type substrate processing apparatus according to a fourth embodiment described herein.

The configuration of the present embodiment is basically the same as that of the processing apparatus 1 described in the first embodiment, and as shown in FIG. 8, the temperature measurement substrate 71 provided with the thermocouple attached to the surface thereof is placed at a bottom of the boat 21. In addition, since a configuration of a temperature controller 260 shown in FIG. 8 is the same as the configuration described with reference to FIG. 5 in the first embodiment in terms of hardware, the same reference numerals are used.

With such a configuration, substrate temperature data measured using the temperature measurement substrate 71 is input to the temperature converter 231 of the temperature conversion controller 230 in the temperature controller 260 and processed. Similar to that described in the first embodiment, the substrate temperature data is converted into the temperature information together with the temperature detection signals at the plurality of locations detected by the temperature sensor 312 constituted by the cascade thermocouple and the temperature detection signals from the temperature sensor 311 constituted by the heater thermocouple and provided at the positions corresponding to the divided heater structures 301 through 304.

On the other hand, similar to the first embodiment, the signals detected by the reflectance meters 201 through 204 are input to the reflectance detector 240 of the temperature controller 260 and converted into the reflectance data. The reflectance data obtained by the reflectance detector 240 is input to the operation processor 250. In the operation processor 250, the thickness of the film attached to each portion of the inner tube 4B of the reaction tube 4 is obtained from each reflectance data obtained by each of the reflectance meters 201 through 204 using the reflectance detector 240, based on the relationship between the reflectance and the thickness of the film stored in the memory 216 in advance.

In the memory 216, a relationship among the detected temperature of the temperature sensor 312 installed at the inner side of the outer tube 4A of the reaction tube 4, the substrate temperature data measured by the temperature measurement substrate 71 and the temperature of the substrate 7 accommodated in the boat 21 of the inner tube 4B are stored as the temperature control coefficient corresponding to each thickness of the film attached to each portion of the inner side of the outer tube 4A of the reaction tube 4. The temperature of the substrate 7 accommodated in the boat 21 may be measured by placing the substrate 7 which corresponds to the temperature measurement substrate 71 at a predetermined position (height) of the boat 21.

In the operation processor 250, based on the information on the thickness of the film attached to each portion of the outer tube 4A of the reaction tube 4 obtained from the signals detected by the reflectance meters 201 through 204, the temperature control coefficient corresponding to the thickness of the film is extracted from the plurality of temperature control coefficients stored in the memory 216. Using the extracted temperature control coefficient, the temperature information inside the outer tube 4A obtained by the temperature converter 231 from the temperature detection signals of the temperature sensor 312 is corrected to obtain the inner temperature of the outer tube 4A. The difference from the target value is calculated for each portion of the outer tube 4A. Thereby, the control target temperature for each portion of the outer tube 4A is obtained.

The difference between the control target temperature for each portion of the outer tube 4A calculated as described above and the temperature for each portion of the outer tube 4A converted by the temperature converter 231 is input to the PID controller (Proportional Integral Differential Controller) 232, and the power signal to be applied to each of the divided heater structures 301 through 304 is generated.

The power signal generated by the PID controller 232 and applied to each of the divided heater structures 301 through 304 is input to the SCR (Silicon Control Rectifier) 270, is rectified by the SCR 270 and is input to each of the divided heater structures 301 through 304. Then, the temperature of each of the divided heater structures 301 through 304 is controlled individually.

While the heater 3 is controlled by the temperature controller 260 whose configuration is described above, the substrate processing is performed according to the process flow of FIG. 4 as described above in "(2) Substrate Processing (Film-forming Step)" in the first embodiment. Thereby, the film is formed on the surface of the substrate 7.

While the steps S404 through S407 of the substrate processing (film-forming step) are being repeatedly performed, the temperature of each of the divided heater structures 301 through 304 is feedback-controlled by the temperature controller 260 individually using the power signal to be applied to each of the divided heater structures 301 through 304 via the SCR 270, wherein the PID controller 232 generates the power signal to be applied to each of the divided heater structures 301 through 304 based on the temperature difference for each portion calculated based on: (i) the control target temperature for each portion of the outer tube 4A calculated using the reflectance data of the wall surface of the outer tube 4A of the reaction tube 4 detected by the reflectance meters 201 through 204; (ii) the temperature for each portion of the outer tube 4A converted by the temperature converter 231 based on temperature data for each portion in the process furnace 2 detected by the temperature sensors 312 and 311; and (iii) the substrate temperature data measured by the temperature measurement substrate 71.

According to the present embodiment, in addition to the effects described in the first embodiment, by feedback-controlling the temperature of each of the divided heater structures 301 through 304 individually in real time using the reflectance data of the wall surface of the outer tube 4A of the reaction tube 4 detected by the reflectance meters 201 through 204, even when the thickness of the film formed on the inner wall surface of the outer tube 4A of the reaction tube 4 is gradually increased by repeatedly performing the film-forming step, it is possible to individually control the temperature of each of the divided heater structures 301 through 304 based on the data of the actual thickness of the film. As a result, it is possible to maintain film-forming conditions inside the reaction tube 4 constant, and it is also possible to stabilize the quality of the film formed on the surface of the substrate 7.

Further, in general, in order to rapidly elevate the temperature of the substrate 7 at the start of the film-forming step, the voltage applied to each of the divided heater structures 301 through 304 is set to be higher than the voltage applied to each of the divided heater structures 301 through 304 during the steady operation. However, by feedback-controlling the temperature of each of the divided heater structures 301 through 304 individually in real time using the reflectance data of the wall surface of the outer tube 4A of the reaction tube 4 detected by the reflectance meters 201 through 204, it is possible to prevent the overshoot, and it is also possible to stabilize the quality of the film formed on the surface of the substrate 7.

Further, by measuring the reflectance in real time using the reflectance data of the wall surface of the outer tube 4A of the reaction tube 4, it is possible to obtain the information on the thickness of the film attached to the inner wall surface of the outer tube 4A of the reaction tube 4, and it is also possible to determine the cleaning timing of the reaction tube 4. As a result, it is possible to prevent the decrease in the heating efficiency of each of the divided heater structures 301 through 304 due to the thickening of the film attached to the inner wall surface of the outer tube 4A of the reaction tube 4. Further, it is possible to prevent a part of the film (which is grown thick and attached to the inner wall surface of the outer tube 4A of the reaction tube 4) from peeling off and being attached to the substrate 7 accommodated in the boat 21.

In addition, by applying the modified example of the first embodiment to the present embodiment, as the heater 3 of the process furnace 2, each of the divided heater structures 301 through 304, which is the resistance heating type heater using the electric resistance, may be replaced with the heater using the radiation such as the lamp heater.

Other Embodiments

While the technique of the present disclosure is described in detail by way of the embodiments described above, the above-described technique is not limited thereto. The above-described technique may be modified in various ways without departing from the scope thereof. For example, the embodiments described above are described by way of an example in which the reaction tube 4 is constituted by the inner tube 4B and the outer tube 4A. However, the present embodiments are not limited thereto. For example, the reaction tube 4 may be constituted by the outer tube 4A without the inner tube 4B.

According to the technique of the present disclosure, an embodiment described below is provided.

A recording medium including: a recording portion in which a step of accommodating a substrate retainer holding a plurality of substrates into an inner tube of a reaction tube including the inner tube and an outer tube provided to cover an outer periphery of the inner tube is recorded; a recording portion in which a step of heating the plurality of substrates by a heater while the substrate retainer is accommodated in the inner tube of the reaction tube is recorded; and a recording portion in which a step of forming a film on surfaces of the plurality of substrates by supplying a process gas into the reaction tube through a gas supplier after the plurality of substrates are heated by the heater is recorded, wherein, a step of measuring a temperature between the inner tube and the outer tube of the reaction tube by a temperature detector; a step of measuring, by a reflectance detector, a reflectance of the film formed by supplying the process gas into the reaction tube through the gas supplier by heating the plurality of substrates by the heater; and a step of feedback-controlling film-forming conditions on the plurality of substrates held by the substrate retainer in the reaction tube, by a controller using: (i) temperature information between the inner tube and the outer tube of the reaction tube of the film measured by the temperature detector; and (ii) reflectance information of the film measured by the reflectance detector are recorded in the recording portion in which the step of forming the film on the surfaces of the plurality of substrates.

The technique in the present disclosure can be applied to the step of forming the film on the substrate in the manufacturing processes of the semiconductor device.

According to some embodiments of the technique in the present disclosure, it is possible to eliminate the discrepancy between the pre-set temperature elevation rate and the actual temperature elevation rate in the reaction tube according to the heater output due to the increase in the accumulative thickness of the film. Thereby, it is possible to mitigate the overshoot at the start of the heating, and it is also possible to reduce the manufacturing cost of the semiconductor device.

What is claimed is:

1. A substrate processing apparatus, comprising:
   a reaction tube in which a substrate is accommodated;
   a heater configured to heat an inside of the reaction tube;
   a gas supplier configured to supply a process gas to the substrate accommodated in the reaction tube;
   an exhauster configured to exhaust the process gas from the inside of the reaction tube;
   a temperature detector configured to measure an inner temperature of the reaction tube;
   a reflectance detector configured to measure a reflectance of a film formed by supplying the process gas through the gas supplier; and
   a controller configured to be capable of performing a feedback control of film-forming conditions on the substrate accommodated in the reaction tube by using temperature information measured by the temperature detector and reflectance information measured by the reflectance detector,
   wherein the controller comprises:
   a memory in which relationships between the inner temperature of the reaction tube measured by the temperature detector and a temperature of the substrate accommodated in the reaction tube are stored as temperature control coefficients respectively for thicknesses of the film formed on a wall of the reaction tube; and
   an operation processor configured to: select, from the temperature control coefficients, a temperature control coefficient corresponding to a thickness calculated from the reflectance measured by the reflectance detector; and correct the inner temperature of the reaction tube by using the temperature control coefficient selected by the operation processor.

2. The substrate processing apparatus of claim 1, wherein the film-forming conditions comprise heating conditions of heating the substrate by the heater, and the controller is further configured to be capable of performing a feedback control of the heating conditions.

3. The substrate processing apparatus of claim 1, wherein the reflectance detector is further configured to measure a reflectance of the wall of the reaction tube through a hole provided at the heater.

4. The substrate processing apparatus of claim 1, further comprising:
   a substrate retainer in which the substrate is supported,
   wherein the substrate supported by the substrate retainer is accommodated in the reaction tube,
   wherein the heater is divided into a plurality of portions corresponding to a plurality of zones of the reaction tube divided along a height thereof, and is configured to heat the inside of the reaction tube by heating the plurality of zones,
   the reflectance detector is configured to measure a reflectance of the wall of the reaction tube at positions corresponding to the plurality of zones heated by the heater, and
   the controller is further configured to feedback-control the heater for each zone in accordance with the film-forming conditions on the substrate using the reflectance information measured by the reflectance detector.

5. The substrate processing apparatus of claim 1, further comprising:
   a substrate retainer in which the substrate is supported,
   a transfer chamber provided below the reaction tube and in which the substrate is transferred into the substrate retainer; and
   a reaction tube vertical driver configured to elevate or lower the substrate retainer between the reaction tube and the transfer chamber,
   wherein the reflectance detector is further configured to measure a reflectance of the film attached to the substrate retainer at a plurality of locations while the substrate retainer is being lowered from the reaction tube to the transfer chamber by the reaction tube vertical driver.

6. The substrate processing apparatus of claim 5, wherein the reaction tube vertical driver is further configured to rotate the substrate retainer while lowering the substrate retainer from the reaction tube to the transfer chamber, and
   the reflectance detector is further configured to measure reflectances of the plurality of locations around the substrate retainer while the substrate retainer is being lowered and rotated.

7. The substrate processing apparatus of claim 5, wherein the reflectance detector comprises a first reflectance detector configured to measure a reflectance of the wall of the reaction tube and a second reflectance detector configured to measure the reflectance of the film attached to the substrate retainer, and
   the controller is further configured to be capable of determining a cleaning timing of the reaction tube using reflectance information of the reaction tube measured by the first reflectance detector and to determine a cleaning time of the substrate retainer using reflectance information of the film attached to the substrate retainer measured by the second reflectance detector.

8. The substrate processing apparatus of claim 1, wherein the controller is further configured to be capable of calculating each thickness of the film based on the reflectance information measured by the reflectance detector, and to feedback-control the heater in accordance with the film-forming conditions on the substrate using the temperature control coefficient stored in the memory based on information on each thickness of the film.

9. The substrate processing apparatus of claim 1, wherein the reflectance detector is further configured to measure a reflectance of a film formed on a front end of a quartz pipe inserted in the reaction tube.

10. The substrate processing apparatus of claim 1, further comprising:
a substrate retainer in which the substrate is supported, wherein the substrate is provided with a thermocouple attached to a surface thereof, and
the controller is further configured to be capable of performing the feedback control of the film-forming conditions on the substrate supported by the substrate retainer in the reaction tube using the inner temperature of the reaction tube measured by the temperature detector, temperature information of the substrate provided with the thermocouple attached to the surface thereof and supported by the substrate retainer and the reflectance information measured by the reflectance detector.

11. The substrate processing apparatus of claim 1, wherein the heater comprises a lamp heater, and the lamp heater is provided to surround the reaction tube and to heat the substrate supported by a substrate retainer accommodated in the reaction tube, and
the controller is further configured to be capable of controlling the lamp heater in accordance with heating conditions at a time when the lamp heater starts heating the substrate by using the reflectance information measured by the reflectance detector.

12. The substrate processing apparatus of claim 1, wherein the controller is further configured to be capable of performing the feedback control of the film-forming conditions while the substrate is being processed.

13. A method of manufacturing a semiconductor device, comprising:
(a) accommodating a substrate in a reaction tube;
(b) heating the substrate while the substrate is accommodated in the reaction tube; and
(c) forming a film on surfaces of the substrate by supplying a process gas into the reaction tube through a gas supplier,
wherein (c) comprises:
(c-1) measuring an inner temperature of the reaction tube;
(c-2) measuring a reflectance of the film formed by supplying the process gas through the gas supplier; and
(c-3) feedback-controlling film-forming conditions on the substrate by a controller using temperature information measured in (c-1) and reflectance information measured in (c-2), and
wherein the controller comprises:
a memory in which relationships between the inner temperature of the reaction tube measured by a temperature detector and a temperature of the substrate accommodated in the reaction tube are stored as temperature control coefficients respectively for thicknesses of the film formed on a wall of the reaction tube; and
an operation processor configured to: select, from the temperature control coefficients, a temperature control coefficient corresponding to a thickness calculated from the reflectance measured by a reflectance detector; and correct the inner temperature of the reaction tube by using the temperature control coefficient selected by the operation processor.

14. The method of claim 13, wherein the film-forming conditions on the substrate comprise heating conditions of heating the substrate , and the heating conditions are feedback-controlled in (c-3).

15. A non-transitory computer-readable recording medium storing a program that causes, by a computer, a substrate processing apparatus to perform:
(a) accommodating a substrate in a reaction tube;
(b) heating the substrate while the substrate retainer is accommodated in the reaction tube; and
(c) forming a film on surfaces of the substrate by supplying a process gas into the reaction tube through a gas supplier,
wherein (c) comprises:
(c-1) measuring an inner temperature of the reaction tube;
(c-2) measuring a reflectance of the film formed by supplying the process gas through the gas supplier; and
(c-3) feedback-controlling film-forming conditions on the plurality of substrates substrate by a controller using temperature information measured in (c-1) and reflectance information measured in (c-2), and
wherein the controller comprises:
a memory in which relationships between the inner temperature of the reaction tube measured by a temperature detector and a temperature of the substrate accommodated in the reaction tube are stored as temperature control coefficients respectively for thicknesses of the film formed on a wall of the reaction tube; and
an operation processor configured to: select, from the temperature control coefficients, a temperature control coefficient corresponding to a thickness calculated from the reflectance measured by a reflectance detector; and correct the inner temperature of the reaction tube by using the temperature control coefficient selected by the operation processor.

* * * * *